United States Patent
Harigae et al.

(10) Patent No.: US 10,833,209 B2
(45) Date of Patent: *Nov. 10, 2020

(54) CONDUCTIVE PASTE, METHOD FOR PRODUCING SAME, AND METHOD FOR PRODUCING SOLAR CELL

(71) Applicant: DOWA Electronics Materials Co., Ltd., Tokyo (JP)

(72) Inventors: Kenichi Harigae, Tokyo (JP); Hiroshi Kamiga, Tokyo (JP); Noriaki Nogami, Tokyo (JP)

(73) Assignee: DOWA Electronics Materials Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/330,878

(22) PCT Filed: Sep. 5, 2017

(86) PCT No.: PCT/JP2017/031968
§ 371 (c)(1),
(2) Date: Mar. 6, 2019

(87) PCT Pub. No.: WO2018/047822
PCT Pub. Date: Mar. 15, 2018

(65) Prior Publication Data
US 2019/0189810 A1    Jun. 20, 2019

(30) Foreign Application Priority Data

Sep. 8, 2016 (JP) ................. 2016-175884

(51) Int. Cl.
*H01L 21/00* (2006.01)
*H01L 31/0224* (2006.01)
(Continued)

(52) U.S. Cl.
CPC .... *H01L 31/022425* (2013.01); *B22F 1/0059* (2013.01); *H01B 1/22* (2013.01);
(Continued)

(58) Field of Classification Search
CPC ......... H01L 31/0224; H01L 31/022425; C03C 3/122; C03C 3/321; C03C 8/02;
(Continued)

(56) References Cited

U.S. PATENT DOCUMENTS 9,039,937 B1    5/2015  Jung et al.
10,030,156 B2   7/2018  Takagi et al.
(Continued)

FOREIGN PATENT DOCUMENTS

CN    102081986      6/2011
CN    103077764 A    5/2013
(Continued)

OTHER PUBLICATIONS

The Patent Office of the People's Republic of China, First Office Action issued in corresponding Chinese Application No. 201780054325, dated Nov. 19, 2019.
(Continued)

*Primary Examiner* — Brook Kebede
(74) *Attorney, Agent, or Firm* — Carmody Torrance Sandak & Hennessey LLP

(57) ABSTRACT

A conductive paste including: a conductive powder containing silver; an indium powder; a silver-tellurium-coated glass powder; a solvent; and an organic binder, wherein the silver-tellurium-coated glass powder is a silver-tellurium-coated glass powder including a tellurium-based glass powder containing tellurium in an amount of 20% by mass or more, and a coating layer on a surface of the tellurium-based glass powder, the coating layer containing silver and tellurium as a main component.

5 Claims, 1 Drawing Sheet

(51) Int. Cl.
- *H01B 1/22* (2006.01)
- *B22F 1/00* (2006.01)
- *B22F 1/02* (2006.01)
- *B22F 9/24* (2006.01)
- *H01L 31/0216* (2014.01)

(52) U.S. Cl.
CPC .......... *H01L 31/0224* (2013.01); *B22F 1/025* (2013.01); *B22F 9/24* (2013.01); *B22F 2001/0066* (2013.01); *B22F 2301/255* (2013.01); *B22F 2301/30* (2013.01); *B22F 2302/256* (2013.01); *H01L 31/02168* (2013.01); *Y02P 70/50* (2015.11)

(58) Field of Classification Search
CPC .. C03C 8/16; C03C 8/18; C03C 17/06; C03C 17/10; B22F 1/0059; H01B 1/22
USPC .......................................................... 438/72
See application file for complete search history.

(56) References Cited

U.S. PATENT DOCUMENTS

| | | | |
|---|---|---|---|
| 10,460,851 B2 * | 10/2019 | Kamiga | H01L 31/022425 |
| 2011/0095240 A1 | 4/2011 | Nakamura et al. | |
| 2014/0008587 A1 | 1/2014 | Yoshida et al. | |
| 2014/0021417 A1 * | 1/2014 | Koike | C03C 8/14 252/514 |
| 2015/0191609 A1 * | 7/2015 | Park | H01L 31/022425 252/514 |
| 2015/0280024 A1 | 10/2015 | Song et al. | |
| 2015/0318419 A1 | 11/2015 | Hayashi et al. | |
| 2015/0357490 A1 | 12/2015 | Park et al. | |
| 2016/0141068 A1 | 5/2016 | Kim et al. | |
| 2018/0033897 A1 | 2/2018 | Kanasaku et al. | |
| 2018/0272425 A1 | 9/2018 | Nogami et al. | |
| 2019/0027620 A1 | 1/2019 | Kamiga et al. | |

FOREIGN PATENT DOCUMENTS

| | | |
|---|---|---|
| CN | 103578603 A | 2/2014 |
| EP | 2903034 | 8/2015 |
| EP | 3270421 | 1/2018 |
| JP | 2005-243500 | 9/2005 |
| JP | 2011-96747 | 5/2011 |
| JP | 2012-033291 | 2/2012 |
| JP | 2014-22194 | 2/2014 |
| JP | 2014-164994 | 9/2014 |
| JP | 2014-207262 | 10/2014 |
| JP | 2016-193813 | 11/2016 |
| KR | 10-2014-0092745 | 7/2014 |
| KR | 10-2015-0146105 | 12/2015 |
| TW | 201527244 | 7/2015 |
| TW | 201616514 | 5/2016 |
| TW | 201618123 | 5/2016 |
| WO | 2012020694 | 2/2012 |
| WO | 2012144335 | 10/2012 |
| WO | 2014050703 | 4/2014 |
| WO | 2016/147867 | 9/2016 |
| WO | 2017158865 | 9/2017 |
| WO | 2017159762 | 9/2017 |

OTHER PUBLICATIONS

Yang et al., "Preparation and electricity performance of silver coating glass frit by electroless silver plating", Material Science and Engineering of Powder Metallurgy, Feb. 2015, vol. 20, No. 1 (English abstract).

Korean Intellectual Property Office, Korean Office Action in Korean Application No. 10-2018-7009679, dated Aug. 6, 2018.

* cited by examiner

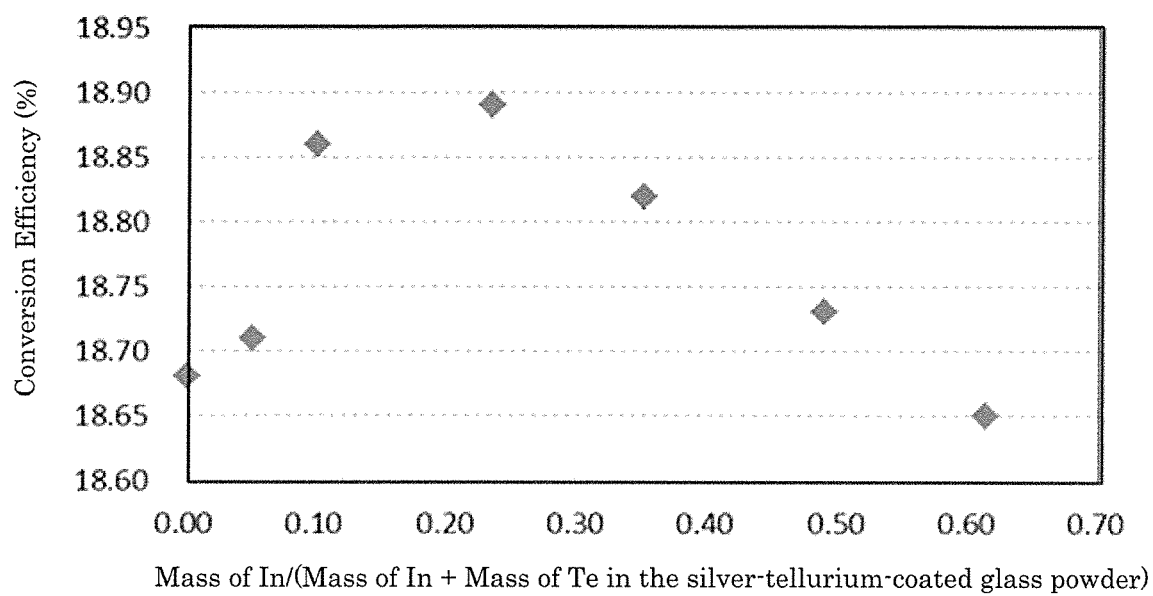

CONDUCTIVE PASTE, METHOD FOR PRODUCING SAME, AND METHOD FOR PRODUCING SOLAR CELL

TECHNICAL FIELD

The present invention relates to a conductive paste suitable as a paste material for an electrode of a solar cell, a method for producing the same, and a method for producing a solar cell.

BACKGROUND ART

Conventionally, a conductive paste containing, for example, a silver powder, a binder, a solvent, and a glass frit has been used as a paste material for an electrode of a solar cell formed of a semiconductor with a pn junction. By using such a conductive paste, wirings of surface electrodes of an arbitrary pattern are formed on an anti-reflection layer typified by silicon nitride on the light receiving surface side of the solar cell.

Under such circumstances, a conductive paste has been proposed, where the conductive paste uses as a glass frit a tellurium-based glass frit (hereinafter may also be referred to as "a tellurium-based glass powder") containing a tellurium oxide to reduce electric resistance when connection with a semiconductor via an anti-reflection layer (hereinafter may also be referred to as "fire-through") is performed, and provides good solar cell characteristics (see, for example, PTL 1).

By including a fine powder of one type of a metal selected from Ti, Bi, Zn, Y, In, and Mo or a compound of the metal, a conductive paste capable of forming a surface electrode having high conductivity and an excellent adhesive force has been proposed (see, for example, PTL 2).

CITATION LIST

Patent Literature

PTL 1: Japanese Patent Application Laid-Open (JP-A) No. 2011-96747
PTL 2: JP-A No. 2005-243500

SUMMARY OF INVENTION

Technical Problem

As applications for an electrode of a solar cell, there is a demand for a paste material and a conductive paste for a solar cell electrode, where the paste material and the conductive paste further reduce contact resistance and provide good solar cell characteristics.

The present invention solves the above existing problems and aims to achieve the following object. Specifically, an object of the present invention is to provide: a conductive paste capable of improving power generation efficiency of a solar cell when used for an electrode of a solar cell; a method for producing the conductive paste; and a method for producing a solar cell.

Solution to Problem

According to the studies by the present inventors, it was found that even if the description of the PTL 1 (JP-A No. 2011-96747) and the description of the PTL 2 (JP-A No. 2005-243500) are combined together, any synergistic effects did not arise, and the power generation efficiency of the solar cell did not improve. Specifically, they found that even if part of the glass frit in the conductive paste using the glass frit (tellurium-based glass powder) containing tellurium oxide was replaced with, for example, an indium (In) powder, the power generation efficiency of the solar cell remained almost unchanged.

However, the present inventors have found that a solar cell having improved power generation efficiency can be obtained by adding an indium (In) powder to the conductive paste using the silver-tellurium-coated glass powder obtained in Japanese Patent Application No. 2017-048982 and PCT/JP2017/010548 claiming priority to Japanese Patent Application No. 2016-161348 the present inventors previously proposed.

The present invention is based on the above findings by the present inventors and means for solving the above problems is as follows. That is,
a conductive paste of the present invention includes a conductive powder containing silver, an indium powder, a silver-tellurium-coated glass powder, a solvent, and an organic binder,
wherein the silver-tellurium-coated glass powder is a silver-tellurium-coated glass powder including a tellurium-based glass powder containing tellurium in an amount of 20% by mass or more, and a coating layer on a surface of the tellurium-based glass powder, the coating layer containing silver and tellurium as a main component.

The amount of the indium powder with respect to the mass of tellurium contained in the silver-tellurium-coated glass powder is preferably in the range of 0.05 to 0.5 in terms of the mass of indium/(the mass of indium+the mass of tellurium in the silver-tellurium-coated glass powder).

The tellurium-based glass powder preferably contains at least one selected from the group consisting of zinc, lead, bismuth, silicon, and aluminum.

Also, a method of the present invention for producing a conductive paste includes:
adding to a silver complex solution, a tellurium-based glass powder containing tellurium in an amount of 20% by mass or more, and then adding a reducing agent to form on a surface of the tellurium-based glass powder, a coating layer containing silver and tellurium as a main component, to thereby obtain a silver-tellurium-coated glass powder; and
mixing the silver-tellurium-coated glass powder, a conductive powder containing silver, an indium powder, a solvent, and an organic binder.

Further, a method of the present invention for producing a solar cell includes printing or coating the conductive paste of the present invention on an anti-reflection layer, and firing.

Advantageous Effects of Invention

The present invention can provide: a conductive paste capable of improving power generation efficiency of a solar cell when used for an electrode of a solar cell; a method for producing the conductive paste; and a method for producing a solar cell.

BRIEF DESCRIPTION OF DRAWINGS

FIG. 1 is a graph presenting the relationship between a ratio (In/(In+Te)) of the mass of In to the mass of tellurium in glass and conversion efficiency of a solar cell.

DESCRIPTION OF EMBODIMENTS (Conductive Paste)
A conductive paste of the present invention includes a conductive powder containing silver, an indium (In) powder, a silver-tellurium-coated glass powder, a solvent, and an organic binder; and if necessary further includes other components.

<Conductive Powder Containing Silver>

The conductive powder containing silver is preferably a silver powder or a metal powder having silver on a surface thereof, or a powder which produces silver when the conductive paste is heated (e.g., silver oxide).

The amount of the conductive powder containing silver in the conductive paste is preferably 70% by mass or more but 92% by mass or less.

A cumulative 50% point of particle diameter ($D_{50}$) of the conductive powder containing silver in the volume-based particle size distribution measured by the laser diffraction particle size distribution measurement is preferably 1 μm or more but 3 μm or less.

The shape of the conductive powder containing silver is not particularly limited and may be appropriately selected depending on the intended purpose. For example, it may be a spherical shape, a flat shape, a rod shape, a linear shape, an amorphous shape, a combination of these shapes, or a combination of shapes having different average particle diameters.

<Indium (In) Powder>

The In powder is preferably a metal In powder or an In powder containing silver. In order to ensure the effects of the present invention, elements other than In contained in the In powder are preferably less than 20% by mass. The present embodiment refers to the case where the In powder is the metal In powder, but it is also possible to obtain the same effects even in the case of using a powder of an alloy of In and silver or an In powder coated with silver.

When the In powder contains silver, the amount of silver in the conductive powder containing silver (e.g., silver powder) may be adjusted depending on the amount of silver in the In powder.

As the elements other than In and silver contained in the In powder, an element having high conductivity (e.g., gold, copper, or aluminum) or an element to be an n-type dopant with respect to silicon may be contained.

The particle surface of the In powder may be oxidized, but ones formed into an oxide powder ($In_2O_3$) as a whole are not included.

A particle diameter of the In powder with a scanning electron microscope (SEM) (SEM particle diameter) is not particularly limited and may be appropriately selected depending on the intended purpose, but is preferably 1 μm or more but 40 μm or less, and in terms of use in a finger electrode of a solar cell, is more preferably 1 μm or more but 10 μm or less.

The shape of the In powder is not particularly limited and may be appropriately selected depending on the intended purpose. For example, it may be a spherical shape, a flat shape, a rod shape, a linear shape, or an amorphous shape.

A method for producing the In powder is not particularly limited and may be appropriately selected depending on the intended purpose. In one exemplary method capable of producing the In powder, an In ingot is heated and melted in a high-boiling-point solvent (e.g., tetraethylene glycol) to a temperature equal to or higher than the melting point thereof, and the resultant is vigorously stirred in the presence of, for example, a fatty acid or a fatty acid amide, followed by rapidly cooling.

In order to prevent oxidation, the In powder in the state of being in high-boiling-point solvent may be incorporated at the time of producing the conductive paste.

<Silver-Tellurium-Coated Glass Powder>

The silver-tellurium-coated glass powder includes a tellurium-based glass powder containing tellurium (Te) in an amount of 20% by mass or more, and a coating layer on a surface of the tellurium-based glass powder, the coating layer containing silver and tellurium as a main component.

For details of the silver-tellurium-coated glass powder, reference shall be made to <Tellurium-based glass powder> and <Coating layer containing silver and tellurium as a main component> described in paragraphs [0012] to [0030] in the specification of Japanese Patent Application No. 2016-161348. For details of the silver-tellurium-coated glass powder, reference shall be made to <Tellurium-based glass powder> and <Coating layer containing silver and tellurium as a main component> described in paragraphs [0012] to [0036] in the specifications of Japanese Patent Application No. 2017-048982 and PCT/JP2017/010548 claiming priority to Japanese Patent Application No. 2016-161348.

The amount of the silver-tellurium-coated glass powder in the conductive paste is preferably 1% by mass or more but 5% by mass or less with respect to the total amount of the conductive paste. When the amount thereof is less than 1% by mass, fire-through may be insufficient, and the series resistance of the solar cell may be high. When the amount thereof is more than 5% by mass, the increase in the resistance components causes increase in line resistance, and the power generation efficiency of the solar cell may be degraded.

As described in Japanese Patent Application No. 2017-048982 and PCT/JP2017/010548 claiming priority to Japanese Patent Application No. 2016-161348, the silver-tellurium-coated glass powder contains a substance containing silver and tellurium as a main component that is present on the surface of the tellurium-based glass powder. The coating layer containing silver and tellurium as a main component means a substance containing silver and tellurium as a main component that is present on the surface of the tellurium-based glass powder. Containing silver and tellurium as a main component means that the total of silver and tellurium is a main component in the coating layer (50% by mass or more but 100% by mass or less). Note that, each of Ag and Te in the coating layer is contained in an amount of 10% by mass or more.

The thickness of the coating layer containing silver and tellurium as a main component is preferably 10 nm or more but 200 nm or less, more preferably 20 nm or more but 150 nm or less.

The amount of tellurium contained in the tellurium-based glass powder is not particularly limited and may be appropriately selected depending on the intended purpose so long as it is 20% by mass or more. For the purpose of increasing the power generation efficiency of a solar cell (reducing the ohmic resistance of an electrode due to fire-through properties), the amount of tellurium is preferably 30% by mass or more, more preferably 40% by mass or more but 90% by mass or less. The above amount of tellurium is defined as an amount thereof contained in the glass powder when it is subjected to composition analysis by X-ray fluorescence.

As the component that is other than tellurium and contained in the tellurium-based glass powder, one or more kinds selected from bismuth (Bi), zinc (Zn), lithium (Li), sodium (Na), potassium (K), boron (B), silicon (Si), aluminum (Al), tungsten (W), molybdenum (Mo), manganese (Mn), iron (Fe), vanadium (V), phosphorus (P), lead (Pb), antimony (Sb), magnesium (Mg), calcium (Ca), strontium (Sr), barium (Ba), titanium (Ti), zirconium (Zr), and lanthanum (La) are preferably contained, and one or more kinds selected from zinc, lead, bismuth, silicon, and aluminum are more preferably contained.

The tellurium in the tellurium-based glass powder may be in the form of any of an oxide, a metal, and an alloy. The oxide of the tellurium is preferably tellurium dioxide ($TeO_2$).

As to the particle size distribution of the silver-tellurium-coated glass powder, a cumulative 10% point of particle diameter ($D_{10}$) is preferably 0.1 μm or more but 10 μm or less, more preferably 0.3 μm or more but 5 μm or less, particularly preferably 0.5 μm or more but 2 μm or less. Also, a cumulative 50% point of particle diameter ($D_{50}$) is preferably 0.1 μm or more but 20 μm or less, more preferably 0.3 μm or more but 10 μm or less, particularly preferably 1 μm or more but 5 μm or less. Further, a cumulative 90% point of particle diameter ($D_{90}$) is preferably 1 μm or more but 60 μm or less, more preferably 1.5 μm or more but 30 μm or less, particularly preferably 1.5 μm or more but 20 μm or less.

The particle size distribution of the silver-tellurium-coated glass powder can be measured with, for example, a laser diffraction particle size distribution analyzer (e.g., Microtrac, manufactured by NIKKISO CO., LTD.).

A BET specific surface area of the silver-tellurium-coated glass powder is not particularly limited and may be appropriately selected depending on the intended purpose. It is preferably 0.1 $m^2/g$ or more but 70 $m^2/g$ or less, more preferably 0.5 $m^2/g$ or more but 10 $m^2/g$ or less.

The BET specific surface area can be measured with, for example, a commercially available BET specific surface area measuring device.

The surface of the silver-tellurium-coated glass powder may be coated with a surface treatment agent made of an organic material such as a fatty acid.

Regarding the points other than the above about the silver-tellurium-coated glass powder used in the present invention, reference can be made to the silver-tellurium-coated glass powder described in the specifications of Japanese Patent Application No. 2017-048982 and PCT/JP2017/010548 claiming priority to Japanese Patent Application No. 2016-161348.

Note that, even if the silver-tellurium-coated glass powder to be used is not the silver-tellurium-coated glass powder described in the specifications of Japanese Patent Application No. 2017-048982 and PCT/JP2017/010548 claiming priority to Japanese Patent Application No. 2016-161348, the effects of the present invention can be achieved if a conductive paste is formed to contain both an indium (In) powder and a powder containing any of an alloy of silver and tellurium, an intermetallic compound, and an amorphous substance (e.g., the silver-coated tellurium powder described in the specification of Japanese Patent Application No. 2016-006613).

In the case where the silver-tellurium-coated glass powder containing the coating layer containing silver and tellurium as a main component is used for the conductive paste, it is possible to improve the power generation efficiency of the solar cell as compared with the tellurium-based glass powder containing no coating layer. One expected reason for this is that it becomes easier to form a conduction path also in the tellurium-based glass powder as a result of silver diffused into the tellurium-based glass powder in a temperature range lower than the firing temperature of the conductive paste. Moreover, since the viscosity of the conductive paste increases to a less extent than in the case of using the tellurium-based glass powder containing no coating layer, there is less need to add a solvent (reduce the amount of the conductive powder containing silver) to lower the viscosity. Therefore, the conductivity of the conductive film after firing is improved, resulting in improvement in the power generation efficiency of the solar cell.

The In powder can further improve the function of improving the power generation efficiency of the solar cell of the silver-tellurium-coated glass powder. The amount of the In powder with respect to the amount of tellurium (mass) contained in the conductive paste (in the silver-tellurium-coated glass powder in the present embodiment) is preferably in the range of 0.05 to 0.5, more preferably in the range of 0.1 to 0.3 in terms of the mass of indium/(the mass of indium+the mass of tellurium in the silver-tellurium-coated glass powder). When the mass of indium/(the mass of indium+the mass of tellurium in the silver-tellurium-coated glass powder) is less than 0.05, almost no auxiliary effects to fire-through are obtained. When it is more than 0.5, adverse effects occur due to increase in resistance components, and the power generation efficiency of the solar cell tends to be degraded.

Note that, the "amount of tellurium contained in the silver-tellurium-coated glass powder" in the calculation of the amount of the In powder in the present invention means a value obtained by multiplying the % by mass of the Te content, which is obtained by composition analysis of the silver-tellurium-coated glass powder with X-ray fluorescence, with the % by mass of the silver-tellurium-coated glass powder in the conductive paste.

That is, Examples and Comparative Examples described below refer to both a value of the % by mass of the Te content obtained by composition analysis of the silver-tellurium-coated glass powder with X-ray fluorescence, and a value re-calculated from this value assuming that the metals other than silver (e.g., tellurium) in the silver-tellurium-coated glass powder are oxides. In the calculation of the amount of the In powder in the conductive paste, however, a value of the % by mass of the tellurium content resulting from analysis with X-ray fluorescence is used as is.

The combination of the In powder and the silver-tellurium-coated glass powder can further improve the power generation efficiency of the solar cell. One expected reason for this is that as the temperature increases during firing, a SiN layer, which is an anti-reflection layer of the solar cell, and tellurium or an oxide of tellurium react (fire-through) to form a conduction path and at the same time cause diffusion of silver to ensure conduction. At this time, In is alloyed with silver and tellurium to reduce the melting temperature, which makes it easier for the above reaction to occur. Alternatively, the respective metals are present near each other, and the reaction is more likely to occur, which improves conductivity of the conductive film after firing and conductivity as the solar cell. This would result in improvement in the power generation efficiency of the solar cell.

<Organic Binder>

The organic binder is not particularly limited and may be a known resin so long as it has a thermally decomposing property and has been used as a resin composition to be fired in the vicinity of 800° C. as an application of an electrode of a solar cell. Examples thereof include organic binders such as cellulose derivatives such as methyl cellulose, ethyl cellulose, and carboxymethyl cellulose, polyvinyl alcohols, polyvinyl pyrrolidones, acrylic resins, alkyd resins, polypropylene resins, polyvinyl chloride-based resins, polyurethane-based resins, rosin-based resins, terpene-based resins, phenol-based resins, aliphatic petroleum resins, vinyl acetate-based resins, vinyl acetate-acrylic acid ester copolymers, and butyral resin derivatives such as polyvinyl butyral. These may be used alone or in combination.

<Solvent>

The solvent is not particularly limited and may be a known solvent so long as it can dissolve the organic binder. The organic binder is preferably dissolved and mixed therein before use in the production of the conductive paste.

Examples of the solvent include dioxane, hexane, toluene, ethyl cellosolve, cyclohexanone, butyl cellosolve, butyl cellosolve acetate, butyl carbitol, butyl carbitol acetate, diethylene glycol diethyl ether, diacetone alcohol, terpineol, methyl ethyl ketone, benzyl alcohol, and 2,2,4-trimethyl-1, 3-pentanediol monoisobutyrate. These may be used alone or in combination.

<Other Components>

Examples of the other components include a surfactant, a dispersant, and a viscosity adjuster.

(Method for Producing Conductive Paste)

A method of the present invention for producing a conductive paste includes: adding to a silver complex solution, a tellurium-based glass powder containing tellurium in an amount of 20% by mass or more, and then adding a reducing agent to form on a surface of the tellurium-based glass powder, a coating layer containing silver and tellurium as a main component, to thereby obtain a silver-tellurium-coated glass powder; and mixing the silver-tellurium-coated glass powder, a conductive powder containing silver, an indium (In) powder, a solvent, and an organic binder; and if necessary further includes other steps.

For the step of forming the silver-tellurium-coated glass powder, reference can be made to the "Method for producing silver-tellurium-coated glass powder" described in paragraphs [0031] to [0042] in the specification of Japanese Patent Application No. 2016-161348. Also, for the step of forming the silver-tellurium-coated glass powder, reference can be made to the "Method for producing silver-telluriumcoated glass powder" described in paragraphs [0037] to [0048] in the specifications of Japanese Patent Application No. 2017-048982 and PCT/JP2017/010548 claiming priority to Japanese Patent Application No. 2016-161348.

Incidentally, the In powder may be added to the paste as it is, or may be added after mixing with the silver-telluriumcoated glass powder in advance.

The step of mixing is not particularly limited and may be appropriately selected depending on the intended purpose. For example, the conductive powder containing silver, the indium powder, the silver-tellurium-coated glass powder, the organic binder, the solvent, and the other components to be added if necessary can be mixed with, for example, an ultrasonic disperser, a disper, a triple roll mill, a ball mill, a bead mill, a biaxial kneader, or a planetary centrifugal stirrer.

The amounts of the components are preferably adjusted so that the viscosity of the conductive paste becomes 100 Pa·s or more but 1,000 Pa·s or less as a 1 rpm value at 25° C. as measured using a corn plate viscometer. When the viscosity of the conductive paste is less than 100 Pa·s, "bleeding" may occur in the low viscosity region. When the viscosity of the conductive paste is more than 1,000 Pa·s, printing failures such as "blurring" may occur in the high viscosity region.

The conductive paste of the present invention containing the silver-tellurium-coated glass powder and the In powder can be more suitably used as a conductive paste for forming electrodes of firing-type solar cells and electrodes and circuits of various electronic components, as compared with conventional conductive pastes.

(Method for Producing Solar Cell)

A method of the present invention for producing a solar cell includes printing or coating the conductive paste of the present invention on an anti-reflection layer and firing; and if necessary further includes other steps.

The anti-reflection layer is formed on a silicon wafer.

Since the solar cell obtained by the method for producing a solar cell is produced using the conductive paste of the present invention, contact resistance can further be lowered and good solar cell characteristics can be obtained.

EXAMPLES

The present invention will next be described by way of Examples. The present invention, however, should not be construed as being limited to these Examples.

Example 1

—Production of Silver-Tellurium-Coated Glass Powder—

10 g of a tellurium-based glass powder (with the following composition: Te: 69.5% by mass, Bi: 23.8% by mass, and Zn: 6.8% by mass (as analysis results by X-ray fluorescence) ($TeO_2$: 67.4% by mass, $Bi_2O_3$: 25.5% by mass, and ZnO: 7.0% by mass when calculated as the corresponding oxides), softening point: 334° C., and density: 5.2 g/cm$^3$) was provided.

Analysis by the X-ray fluorescence was performed with JSX-3201 manufactured by JEOL Ltd., with a voltage of 30 kV, a current of 0.080 mA, a live time of 400 sec, and pass: Air. The analysis in the following was performed in the same manner.

3.47 g of a silver nitrate aqueous solution containing silver at 32% by mass was mixed and diluted in a 1 L-beaker where 787 g of pure water was being stirred, to thereby prepare a silver nitrate aqueous solution containing 1.11 g of silver.

Subsequently, 2.5 g of 28% by mass aqueous ammonia was added as a complexing agent to this beaker to obtain a silver amine complex salt aqueous solution (pH: 11). The liquid temperature of this silver amine complex salt aqueous solution was adjusted to 30° C. and then 10 g of the tellurium-based glass powder was added thereto. Immediately after that, a previously prepared mixture containing 0.3 g of hydrazine serving as a reducing agent, 10.3 g of silver colloid [the solvent was pure water, the particle diameter (TEM particle diameter) of the contained nanoparticle silver as measured with a transmission electron microscope (TEM) was 5 nm to 40 nm, and the amount of the nanoparticle silver was 0.01 g (0.001 times the amount of silver in the aqueous solution)], and 20 g of pure water was added thereto. With an aging time (waiting time for preventing unreduced silver from remaining in the liquid) being set to 5 minutes, a coating layer containing silver and tellurium as a main component was formed on the surface of the tellurium-based glass powder.

5 minutes after the addition of the reducing agent, a silver-coated glass powder-containing slurry was filtrated through aspiration, and was washed with pure water until the electrical conductivity of the liquid after the washing became 0.5 mS/m or lower, whereby a cake was obtained. The obtained cake was dried for 10 hours with a vacuum dryer of 75° C., to thereby obtain a silver-tellurium-coated glass powder of Example 1 containing a coating layer containing silver and tellurium as a main component.

The pH of the filtrate at the time of the aspiration filtration was found to be 9.6. As a result of ICP emission analysis (SPS5100, manufactured by SII Co.), Te was found to be 89.7 ppm.

Next, composition analysis was performed on the obtained silver-tellurium-coated glass powder using X-ray fluorescence, the following was found: Ag: 17.3% by mass, Te: 56.0% by mass, Bi: 20.9% by mass, and Zn: 5.9% by mass.

Here, when the components other than Ag were calculated as corresponding oxides, the following was found: Ag: 14.6% by mass, $TeO_2$: 59.4% by mass, $Bi_2O_3$: 19.8% by mass, and ZnO: 6.2% by mass.

Next, various properties of the obtained silver-tellurium-coated glass powder were measured in the following manners. The results are presented in Table 1.

[Particle Size Distribution]

The particle size distribution of the silver-tellurium-coated glass powder was measured with a laser diffraction particle size distribution analyzer [Microtrac particle size distribution analyzer manufactured by NIKKISO CO., LTD. (MT3300EXII, manufactured by Microtrac Co.)] to obtain a cumulative 10% point of particle diameter ($D_{10}$), a cumulative 50% point of particle diameter ($D_{50}$), and a cumulative 90% point of particle diameter ($D_{90}$).

[BET Specific Surface Area]

The BET specific surface area of the silver-tellurium-coated glass powder was measured with a specific surface area measuring device (device name: Macsorb, manufactured by Mountech Co.) by the single point BET method using nitrogen adsorption. Note that, in the measurement of the BET specific surface area, degassing conditions before the measurement were 60° C. and 10 minutes.

—Preparation of In Powder—

96 g of an ingot of 99.99% by mass In was heated to 170° C. in 100 g of tetraethylene glycol serving as a solvent, and the In was melted. After that, ethylenebiscapric acid was added thereto and the resultant was vigorously stirred at 710 rpm, followed by rapidly cooling, to obtain an In powder of a metal In.

The SEM particle diameter of the obtained In powder was 10 μm to 400 μm, and the particle diameter was adjusted to be 10 μm to 100 μm through a 150 mesh sieve.

Next, the obtained silver-tellurium-coated glass powder and the In powder were used to produce a conductive paste in the following manner.

—Production of Conductive Paste—

The following components were weighed so as to be 1.677% by mass of the silver-tellurium-coated glass powder (silver content: 17.3% by mass), 90.0% by mass of a silver powder (AG-2.5-8F, manufactured by DOWA HIGHTECH CO., LTD., a cumulative 50% point of particle diameter ($D_{50}$)=1.5 μm), 0.096% by mass of the In powder, 0.41% by mass of a vehicle (ethyl cellulose 10 cps 30% by mass (manufactured by Wako Pure Chemical Industries, Ltd.) butyl carbitol acetate solution), 2.40% by mass of a vehicle (EU-5638, acrylic resin 46.1% by mass butyl carbitol acetate solution, manufactured by NIPPON CARBIDE INDUSTRIES CO., INC.), 3.11% by mass of a solvent (CS-12, manufactured by JNC CO., LTD., TEXANOL), 1.54% by mass of a solvent (manufactured by Wako Pure Chemical Industries, Ltd., butyl carbitol acetate), 0.26% by mass of magnesium stearate (manufactured by Wako Pure Chemical Industries, Ltd.), and 0.51% by mass of oleic acid (manufactured by Wako Pure Chemical Industries, Ltd.). These components were mixed (preliminarily mixed) with a planetary centrifugal stirrer (ARE-310, manufactured by THINKY Corporation), is followed by kneading with a triple roll (M-80S, manufactured by EXAKT Co.), to thereby obtain a conductive paste.

Since the Te content in the composition analysis of the silver-tellurium-coated glass powder by X-ray fluorescence was 56.0% by mass, the mass of Te was 0.94% by mass in 1.677% by mass of the silver-tellurium-coated glass powder. With respect to the In content (0.096% by mass) of the In powder, the mass of In/(the mass of In+the mass of tellurium in the silver-tellurium-coated glass powder)=0.09.

After measuring the viscosity of the obtained conductive paste, an appropriate amount to the amount of the paste (0.35% by mass in Example 1) of a mixed solvent of TEXANOL and butyl carbitol in a mass ratio of 1:1 was additionally added in consideration of the measured viscosity, to adjust the viscosity so as to be a viscosity at 1 rpm of 290±20 Pa·s and a viscosity at 5 rpm of 70±2 Pa·s when measured for a 5-min value at 1 rpm and a 1-min value at 5 rpm using a cone plate of CPE-52 in a viscometer (HBDV-III ULTRA, manufactured by Brookfield Co.).

The performance of the conductive paste was evaluated as follows for a high quality print pattern in these ranges of the 5-min value at 1 rpm and the 1-min value at 5 rpm. The results are presented in Table 2.

Next, the obtained conductive paste was used to produce a solar cell in the following manner.

<Production of Solar Cell>

An aluminum paste (ALSOLAR 14-7021, manufactured by TOYO ALUMINIUM K.K.) was used to form a solid pattern of 154 mm square on a back surface of a silicone substrate (105 Ω/sq.) for a solar cell using a screen printing machine (MT-320T, manufactured by Microtrac Co.).

A hot air dryer was used for drying at 200° C. for 10 minutes.

The conductive paste of Example 1 was used to form a finger electrode having a width of 40 μm and three bus bar electrodes on a front surface of the substrate.

A hot air dryer was used for drying at 200° C. for 10 minutes.

A high-speed firing IR furnace (manufactured by NGK INSULATORS, LTD.) was used in high-speed firing for in-out 21 sec with the temperature upon the peak (firing temperature) being set to 820° C. Through the above procedure, a solar cell was produced.

<Evaluation of Solar Cell Characteristics>

The produced solar cell was evaluated for solar cell characteristics using a solar simulator manufactured by WACOM Co.

The conversion efficiency of the obtained solar cell was found to be 18.86% at a firing temperature of 820° C. The results are presented in Table 2.

<Evaluation of Volume Resistivity>

The conductive paste of Example 1 was applied on a Si substrate through screen printing under the following conditions, to form a conductive film.

Printing device: MT-320T manufactured by Micro-tec Co., Ltd.

Plate: line width 500 μm, routing 37.5 mm, 250 mesh, line diameter 23 μm

Printing conditions: squeegee pressure 180 Pa, printing rate 80 mm/s, clearance 1.3 mm The obtained film was subjected to a heat treatment at 150° C. for 10 minutes using an atmospheric circulation drying apparatus.

Next, the resultant film was fired using a high-speed firing furnace at a peak temperature of 820° C. and in-out 21 sec, to produce a conductive film.

Next, a surface roughness meter (SURFCOM 480B-12, manufactured by TOKYO SEIMITSU CO., LTD.) was used to measure an average thickness of the is obtained conductive film by measuring a difference in level between a part at which no film was printed on the Si substrate and a part at which the conductive film was formed on the Si substrate.

Next, a value of resistivity was measured with a digital multimeter (R7451A, manufactured by ADC CORPORATION) at positions of the lengths (intervals) of the conductive film. The volume of the conductive film was determined based on the sizes (average thickness, width, and length) of each conductive film. From this volume and the value of resistivity, the volume resistivity of the conductive film was found to be 1.88 μΩ·cm.

Example 2

A silver-tellurium-coated glass powder was obtained in the same manner as in Example 1, except that the tellurium-based glass powder was changed to a tellurium-based glass powder having the following composition: Te: 51.3% by mass, Pb: 38.6% by mass, and Zn: 10.0% by mass as analysis results by X-ray fluorescence, and containing lead and having a softening point 421° C. and a density of 5.1 g/cm$^3$.

Next, the composition analysis of the obtained silver-tellurium-coated glass powder (containing Pb) was performed using X-ray fluorescence. As a result, the silver-tellurium-coated glass powder was found to contain Ag: 10.4% by mass, Te: 46.3% by mass, Pb: 34.1% by mass, and Zn: 9.2% by mass.

When the components other than Ag are calculated as corresponding oxides in the same manner as in Example 1, the silver-tellurium-coated glass powder contain Ag: 9.4% by mass, TeO$_2$: 48.1% by mass, PbO: 32.6% by mass, and ZnO: 9.9% by mass.

The properties of the silver-tellurium-coated glass powder were measured in the same manner as in Example 1. The results are presented in Table 1.

The pH of the filtrate was 9.6. As a result of ICP emission analysis (SPS 5100, manufactured by SII Corporation), Te was 93 ppm and Pb was 1 ppm or less.

Next, a conductive paste was prepared in the same manner as in Example 1, except that the obtained silver-tellurium-coated glass powder (containing Pb) was used. An appropriate amount to the amount of the paste (0.42% by mass in Example 2) of a mixed solvent of TEXANOL and butyl carbitol in a mass ratio of 1:1 was added to adjust the viscosity so as to be a viscosity at 1 rpm of 290±20 Pa·s and a viscosity at 5 rpm of 70±2 Pa·s.

Since the Te content in the composition analysis of the silver-tellurium-coated glass powder by X-ray fluorescence is 46.3% by mass, the mass of Te is calculated as 0.78% by mass in 1.677% by mass of the silver-tellurium-coated glass powder. With respect to the In content (0.096% by mass), the mass of In/(the mass of In+the mass of tellurium in the silver-tellurium-coated glass powder)=0.11.

Next, a solar cell was produced in the same manner as in Example 1, and solar cell characteristics were evaluated. The results are presented in Table 2.

The conversion efficiency of the obtained solar cell was found to be 18.55% at a firing temperature of 820° C.

The volume resistivity of the conductive film was found to be 1.98 μΩ·cm.

Comparative Example 1

A conductive paste and a solar cell were produced in the same manner as in Example 1, except that no In powder was added and the amount of the silver-tellurium-coated glass powder was changed to 1.77% by mass, and the properties of the conductive paste and the solar cell characteristics were evaluated in the same manner as in Example 1. The results are presented in Table 2.

The conversion efficiency of the obtained solar cell was found to be 18.68% at a firing temperature of 820° C. The volume resistivity of the conductive film was found to be 2.03 μΩ·cm.

Comparative Example 2

A conductive paste and a solar cell were produced in the same manner as in Example 2, except that no In powder was added and the amount of the silver-tellurium-coated glass powder (containing Pb) was changed to 1.77% by mass, and the properties of the conductive paste and the solar cell characteristics were evaluated in the same manner as in Example 2. The results are presented in Table 2.

The conversion efficiency of the obtained solar cell was found to be 18.38% at a firing temperature of 820° C. The volume resistivity of the conductive film was found to be 1.92 μΩ·cm.

Comparative Example 3

A conductive paste and a solar cell were produced in the same manner as in Example 1, except that the silver-tellurium-coated glass powder was changed to 1.6% by mass of a tellurium-based glass powder which is a raw material of the silver-tellurium-coated glass powder, the amount of the silver powder (AG-2.5-8F, manufactured by DOWA HIGHTECH CO., LTD., a cumulative 50% point of particle diameter ($D_{50}$)=1.5 μm) was changed to 90.2% by mass, and the amount of the In powder was changed to 0.1% by mass (the mass of In/(the mass of In+the mass of tellurium in the tellurium-based glass powder)+0.1). The properties of the conductive paste and the solar cell characteristics were evaluated in the same manner to as in Example 1. The results are presented in Table 2.

The conversion efficiency of the obtained solar cell was found to be 18.50% at a firing temperature of 820° C. The volume resistivity of the conductive film was found to be 2.00 μΩ·cm.

Comparative Example 4

A conductive paste and a solar cell were produced in the same manner as in Comparative Example 3, except that no In powder was added. The properties of the conductive paste and the solar cell characteristics were evaluated in the same manner as in Example 1. The results are presented in Table 2.

The conversion efficiency of the obtained solar cell was found to be 18.51% at a firing temperature of 820° C. The volume resistivity of the conductive film was found to be 1.98 μΩ·cm.

Comparative Example 5

A conductive paste and a solar cell were produced in the same manner as in Comparative Example 3, except that 0.121% by mass of an indium oxide powder (manufactured by DOWA HIGHTECH CO., LTD.) instead of the In powder so that the amount of the In would be the same, and the amount of the silver powder (AG-2.5-8F, manufactured by DOWA HIGHTECH CO., LTD., a cumulative 50% point of particle diameter ($D_{50}$)+1.5 μm) was changed to 90.2% by mass. The properties of the conductive paste and the solar cell characteristics were evaluated in the same manner as in Example 1. The results are presented in Table 2.

The conversion efficiency of the obtained solar cell was found to be 18.27% at a firing temperature of 820° C. The volume resistivity of the conductive film was found to be 1.99 μΩ·cm.

Comparative Example 6

A silver-coated glass powder was obtained in the same manner as in Example 1, except that the glass powder was changed to a commercially available product ASF-1898B containing no tellurium (manufactured by Asahi Glass Co., Ltd., borosilicate glass, softening point: 438° C., density: 3.4 g/cm$^3$). In this case, since the glass powder contained no tellurium, the glass surface would be covered with silver.

In order to perform comparative evaluation with the conductive paste of Example 1, a conductive paste was produced and properties of the conductive paste were evaluated in the same manner as in Example 1, except that the following components were weighed so as to be 87.6% by mass of a silver powder (AG-2.5-8F, manufactured by DOWA HIGHTECH CO., LTD., a cumulative 50% point of particle diameter ($D_{50}$)+1.5 μm), 0.10% by mass of the In powder, 2.4% by mass of tellurium dioxide (manufactured by Wako Pure Chemical Industries, Ltd.) (the mass of In/(the mass of In+the mass of tellurium)=0.05), 1.58% by mass of the above silver-coated powder, 0.19% by mass of bismuth oxide (manufactured by DOWA HIGHTECH CO., LTD.) as a fire-through auxiliary agent, 0.41% by mass of a vehicle (ethyl cellulose 10 cps 30% by mass (manufactured by Wako Pure Chemical Industries, Ltd.) butyl carbitol acetate solution), 2.38% by mass of a vehicle (EU-5638, acrylic resin 46.1% by mass butyl carbitol acetate solution, manufactured by NIPPON CARBIDE INDUSTRIES CO., INC.), 1.56% by mass of a solvent (CS-12, manufactured by JNC CO., LTD., TEXANOL), 3.03% by mass of a solvent (manufactured by Wako Pure Chemical Industries, Ltd., butyl carbitol acetate), 0.25% by mass of magnesium stearate (manufactured by Wako Pure Chemical Industries, Ltd.), and 0.51% by mass of oleic acid (manufactured by Wako Pure Chemical Industries, Ltd.).

Next, a solar cell was produced in the same manner as in Example 1, and solar cell characteristics were evaluated. The results are presented in Table 2. The conversion efficiency of the obtained solar cell was found to be 17.83% at a firing temperature of 820° C. The volume resistivity of the conductive film was found to be 2.63 μΩ·cm.

Comparative Example 7

A conductive paste and a solar cell were produced in the same manner as in Comparative Example 6, except that no In powder was added and the amount of the silver-coated glass powder was changed to 1.68% by mass. The properties of the conductive paste and the solar cell characteristics were evaluated in the same manner as in Example 1. The results are presented in Table 2.

The conversion efficiency of the obtained solar cell was found to be 17.85% at a firing temperature of 820° C. The volume resistivity of the conductive film was found to be 2.68 μΩ·cm.

TABLE 1

|  | Particle size distribution (μm) | | | BET specific surface area (m$^2$/g) |
| --- | --- | --- | --- | --- |
|  | $D_{10}$ | $D_{50}$ | $D_{90}$ |  |
| Example 1 | 0.5 | 1.0 | 1.9 | 5.73 |
| Example 2 | 0.8 | 3.9 | 18.5 | 2.44 |

TABLE 2

|  | In powder | Glass frit | Conversion Efficiency (%) | Volume Resistivity (μΩ · cm) | In/(In + Te) |
| --- | --- | --- | --- | --- | --- |
| Ex. 1 | Present | Silver-tellurium-coated glass | 18.86 | 1.88 | 0.09 |
| Comp. Ex. 1 | Absent | Silver-tellurium-coated glass | 18.68 | 2.03 | — |
| Ex. 2 | Present | Silver-tellurium-coated glass (containing Pb) | 18.55 | 1.98 | 0.11 |
| Comp. Ex. 2 | Absent | Silver-tellurium-coated glass (containing Pb) | 18.38 | 1.92 | — |
| Comp. Ex. 3 | Present | Tellurium-based glass | 18.50 | 2.00 | 0.1 |
| Comp. Ex. 4 | Absent | Tellurium-based glass | 18.51 | 1.98 | — |
| Comp. Ex. 5 | In$_2$O$_3$ | Tellurium-based glass | 18.27 | 1.99 | 0.1 |
| Comp. Ex. 6 | Present | Silver-coated borosilicate glass + TeO$_2$ powder | 17.83 | 2.63 | 0.05 |
| Comp. Ex. 7 | Absent | Silver-coated borosilicate glass + TeO$_2$ powder | 17.85 | 2.68 | — |

The above results indicate that the conductive pastes of Examples 1 and 2, each containing the silver-tellurium-coated glass powder and the In powder, were able to produce a conductive film having a low volume resistivity as compared with the case of using no In powder and the case of using the tellurium-based glass powder containing no coating layer containing silver and tellurium as a main component, and further had the effect of improving the conversion efficiency of the solar cell.

Also, comparison between Comparative Example 3 and Comparative Example 4 indicates that there were almost no differences in the conversion efficiency of the solar cell and the volume resistivity of the conductive film in the case where the In powder was added but the silver-tellurium coating was absent.

Also, comparison among Comparative Examples 3 to 5 indicate that the conversion efficiency of the solar cell and the volume resistivity of the conductive film did not improve even by the addition of the In oxide powder, but rather were degraded. The same can be expected also in the case of the silver-tellurium-coated glass.

Also, comparison between Examples and Comparative Examples 6 and 7 indicates that the effect resulting from the addition of the In powder was not observed when the glass contained no tellurium even in the case of using the silver-tellurium-coated glass powder obtained by the same treatment of silver coating.

Next, an appropriate range of the amount of In to be added to the conductive paste was studied in the same manner as in Example 1, except that the ratio between the amount of In and the amount of the silver-tellurium-coated glass was varied to change the mass of indium (In)/(the mass of indium (In)+the mass of tellurium (Te) in the silver-tellurium-coated glass powder). The results are presented in Table 3 and FIG. 1.

TABLE 3

| Amount of In (% by mass) | Amount of silver-tellurium-coated glass (% by mass) | Amount of Te (% by mass) | Amount of In/(Amount of In + Amount of Te) | Conversion Efficiency (%) |
| --- | --- | --- | --- | --- |
| 0.000 | 1.773 | 0.99 | 0.00 | 18.68 |
| 0.051 | 1.722 | 0.96 | 0.05 | 18.71 |
| 0.096 | 1.677 | 0.94 | 0.09 | 18.86 |
| 0.258 | 1.515 | 0.85 | 0.23 | 18.89 |
| 0.412 | 1.361 | 0.76 | 0.35 | 18.82 |
| 0.617 | 1.156 | 0.65 | 0.49 | 18.73 |
| 0.832 | 0.941 | 0.53 | 0.61 | 18.65 |

The results of Table 3 and FIG. 1 indicate that the amount of the In powder with respect to the mass of tellurium contained in the silver-tellurium-coated glass powder is preferably such an amount that the mass of indium/(the mass of indium+the mass of tellurium in the silver-tellurium-coated glass powder is in the range of 0.05 to 0.5, more preferably such an amount that it is in the range of 0.1 to 0.3.

INDUSTRIAL APPLICABILITY

The silver-tellurium-coated glass powder of the present invention can be used as a conductive paste material for forming electrodes and circuits of various electronic components and in particular can be suitably used as a conductive paste for an electrode of a solar cell.

The invention claimed is:

1. A conductive paste comprising:
   a conductive powder containing silver;
   an indium powder;
   a silver-tellurium-coated glass powder;
   a solvent; and
   an organic binder,
   wherein the silver-tellurium-coated glass powder is a silver-tellurium-coated glass powder including a tellurium-based glass powder containing tellurium in an amount of 20% by mass or more, and a coating layer on a surface of the tellurium-based glass powder, the coating layer containing silver and tellurium as a main component.

2. The conductive paste according to claim 1, wherein an amount of the indium powder with respect to a mass of tellurium contained in the silver-tellurium-coated glass powder is in a range of 0.05 to 0.5 in terms of a mass of indium/(the mass of indium+the mass of tellurium in the silver-tellurium-coated glass powder).

3. The conductive paste according to claim 1, wherein the tellurium-based glass powder contains at least one selected from the group consisting of zinc, lead, bismuth, silicon, and aluminum.

4. A method for producing a conductive paste, the method comprising:
   adding to a silver complex solution, a tellurium-based glass powder containing tellurium in an amount of 20% by mass or more, and then adding a reducing agent to form on a surface of the tellurium-based glass powder, a coating layer containing silver and tellurium as a main component, to thereby obtain a silver-tellurium-coated glass powder; and
   mixing the silver-tellurium-coated glass powder, a conductive powder containing silver, an indium powder, a solvent, and an organic binder.

5. A method for producing a solar cell, the method comprising:
   printing or coating the conductive paste according to claim 1 on an anti-reflection layer, and firing.

* * * * *